(12) United States Patent
Park et al.

(10) Patent No.: US 10,069,035 B2
(45) Date of Patent: Sep. 4, 2018

(54) LIGHT-EMITTING DEVICE AND LIGHTING SYSTEM

(71) Applicant: LG INNOTEK CO., LTD., Seoul (KR)

(72) Inventors: Chan Keun Park, Seoul (KR); Jae Woong Han, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/329,707

(22) PCT Filed: Jul. 24, 2015

(86) PCT No.: PCT/KR2015/007753
§ 371 (c)(1),
(2) Date: Jan. 27, 2017

(87) PCT Pub. No.: WO2016/018010
PCT Pub. Date: Feb. 4, 2016

(65) Prior Publication Data
US 2017/0213935 A1 Jul. 27, 2017

(30) Foreign Application Priority Data

Jul. 28, 2014 (KR) ........................ 10-2014-0095497

(51) Int. Cl.
*H01L 33/14* (2010.01)
*H01L 33/00* (2010.01)
(Continued)

(52) U.S. Cl.
CPC ........ *H01L 33/0025* (2013.01); *H01L 33/025* (2013.01); *H01L 33/06* (2013.01); *H01L 33/145* (2013.01); *H01L 33/32* (2013.01)

(58) Field of Classification Search
CPC ......... H01L 33/32; H01L 33/06; H01L 33/04; H01L 2924/0002; B82Y 20/00;
(Continued)

(56) References Cited

U.S. PATENT DOCUMENTS 6,172,382 B1  1/2001  Nagahama et al.
8,987,757 B2  3/2015  Moon et al.
(Continued)

FOREIGN PATENT DOCUMENTS

JP  2007-019277  1/2007
JP  2007-067454  3/2007
(Continued)

OTHER PUBLICATIONS

International Search Report (with English translation) and Written Opinion dated Nov. 11, 2015 issued in Application No. PCT/KR2015/007753.

*Primary Examiner* — Michael Carter
*Assistant Examiner* — Mohammed R Alam
(74) *Attorney, Agent, or Firm* — Ked & Associates LLP

(57) ABSTRACT

One embodiment relates to a light-emitting device, a method for manufacturing the light-emitting device, a light-emitting device package, and a lighting system. The light-emitting device, according to the one embodiment, can comprise: a first conductive semiconductor layer; an active layer on the first conductive semiconductive layer; a gallium nitride based superlattice layer on the active layer; and a second conductive semiconductor layer on the gallium nitride based superlattice layer. The gallium nitride based superlattice layer can comprise: a first gallium nitride based superlattice layer on the active layer; and a second gallium nitride based superlattice layer on the first gallium nitride based superlattice layer.

18 Claims, 6 Drawing Sheets

(51) Int. Cl.
*H01L 33/06* (2010.01)
*H01L 33/32* (2010.01)
*H01L 33/02* (2010.01)

(58) Field of Classification Search
CPC .. H01S 5/34333; H01S 5/2013; H01S 5/3403; H01S 5/2009; H01S 5/32341; H01S 5/3054; H01S 5/3216; H01S 2301/173
See application file for complete search history.

(56) References Cited

U.S. PATENT DOCUMENTS

| | | | |
|---|---|---|---|
| 2005/0056824 A1* | 3/2005 | Bergmann | H01L 33/06 257/14 |
| 2007/0008998 A1 | 1/2007 | Ohta et al. | |
| 2009/0206325 A1* | 8/2009 | Biwa | H01L 33/06 257/28 |
| 2010/0025657 A1* | 2/2010 | Nagahama | B82Y 20/00 257/13 |
| 2010/0123119 A1 | 5/2010 | Kim et al. | |
| 2011/0168977 A1* | 7/2011 | Eichler | H01S 5/34333 257/13 |
| 2013/0134475 A1* | 5/2013 | Han | H01L 33/04 257/101 |
| 2015/0287876 A1 | 10/2015 | Han et al. | |

FOREIGN PATENT DOCUMENTS

| | | |
|---|---|---|
| KR | 10-2009-0058364 | 6/2009 |
| KR | 10-2010-0077264 | 7/2010 |
| KR | 10-2012-0011131 | 2/2012 |
| KR | 10-2012-0053190 | 5/2012 |
| KR | 10-2014-0050810 | 4/2014 |

\* cited by examiner

LIGHT-EMITTING DEVICE AND LIGHTING SYSTEM

CROSS-REFERENCE TO RELATED PATENT APPLICATIONS

This application is a U.S. National Stage Application under 35 U.S.C. § 371 of PCT Application No. PCT/KR2015/007753, filed Jul. 24, 2015, which claims priority to Korean Patent Application No. 10-2014-0095497, filed Jul. 28, 2014, whose entire disclosures are hereby incorporated by reference.

TECHNICAL FIELD

Embodiments relate to a light emitting device, a method of manufacturing a light emitting device, a light emitting device package and a lighting system.

BACKGROUND ART

A light emitting device (LED) is a p-n diode for converting electrical energy into optical energy and may be generated by a combination of Group III and V elements. An LED can implement various colors by adjusting a composition ratio of compound semiconductors.

An LED emits energy corresponding to an energy gap of a conduction band and a valance band by combining electrons of an n layer and holes of a p layer upon applying a forward voltage. This energy is emitted in the form of heat or light. An LED emits energy in the form of light.

For example, nitride semiconductors have been spotlighted in the fields of optical devices and high-output electronic devices due to high thermal stability and wide bandgap energy thereof. In particular, a blue LED, a green LED, an ultraviolet (UV) LED, etc. using nitride semiconductors are widely used.

In the related art, there is technology of providing an electron blocking layer between an active layer and a second conductivity type semiconductor layer to prevent overflow of electrons to increase light emitting efficiency. However, an electron blocking function was not properly performed.

In addition, in the related art, since carriers are concentrated on the center of a pad electrode, light emitting efficiency may deteriorate.

DISCLOSURE

Technical Problem

Embodiments provide a light emitting device capable of maximizing an electron blocking function to improve light emitting efficiency, a method of manufacturing a light emitting device, a light emitting device package and a lighting system.

Embodiments provide a light emitting device capable of improving a current spreading function to improve light emitting efficiency, a method of manufacturing a light emitting device, a light emitting device package and a lighting system.

Technical Solution

A light emitting device according to the embodiment may include a first conductivity type semiconductor layer 112; an active layer 114 formed on the first conductivity type semiconductor layer 112; a gallium nitride based superlattice layer 120 formed on the active layer 114; and a second conductivity type semiconductor layer 116 formed on the gallium nitride based superlattice layer 120.

The gallium nitride based superlattice layer 120 may include a first gallium nitride based superlattice layer 122 formed on the active layer 114 and a second gallium nitride based superlattice layer 124 formed on the first gallium nitride based superlattice layer 122.

Band gap energy of the first gallium nitride based superlattice layer 122 may be less than that of the second gallium nitride based superlattice layer 124.

A lighting system according to the embodiment may include a light emitting unit including the light emitting device.

Advantageous Effects

Embodiments can provide a light emitting device capable of maximizing an electron blocking function to improve light emitting efficiency, a method of manufacturing a light emitting device, a light emitting device package and a lighting system.

Embodiments can provide a light emitting device capable of improving a current spreading function to improve light emitting efficiency, a method of manufacturing a light emitting device, a light emitting device package and a lighting system.

BEST MODE

In the following description of the embodiments, it will be understood that, when each layer (film), area, pattern or structure is referred to as being formed "on" or "under" a substrate or each layer (film), area, pad, pattern or structure, it can be directly "on" or "under" a substrate or each layer (film), area, pad or pattern or be indirectly formed with one or more intervening layers therebetween. In addition, it will also be understood that "on" or "under" the layer may mean an upward direction and a downward direction of the layer.

Figure 1:
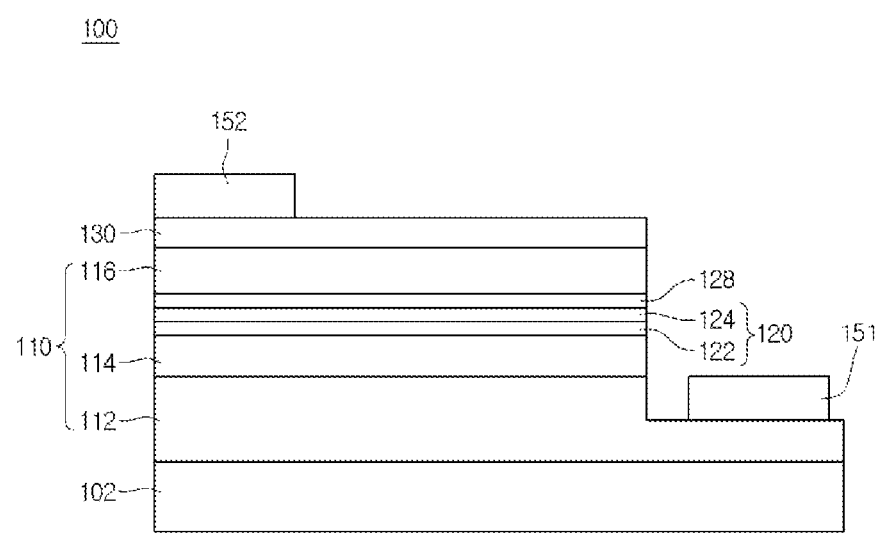
FIG. 1 is a cross-sectional view of a light emitting device according to an embodiment.
Figure 2:
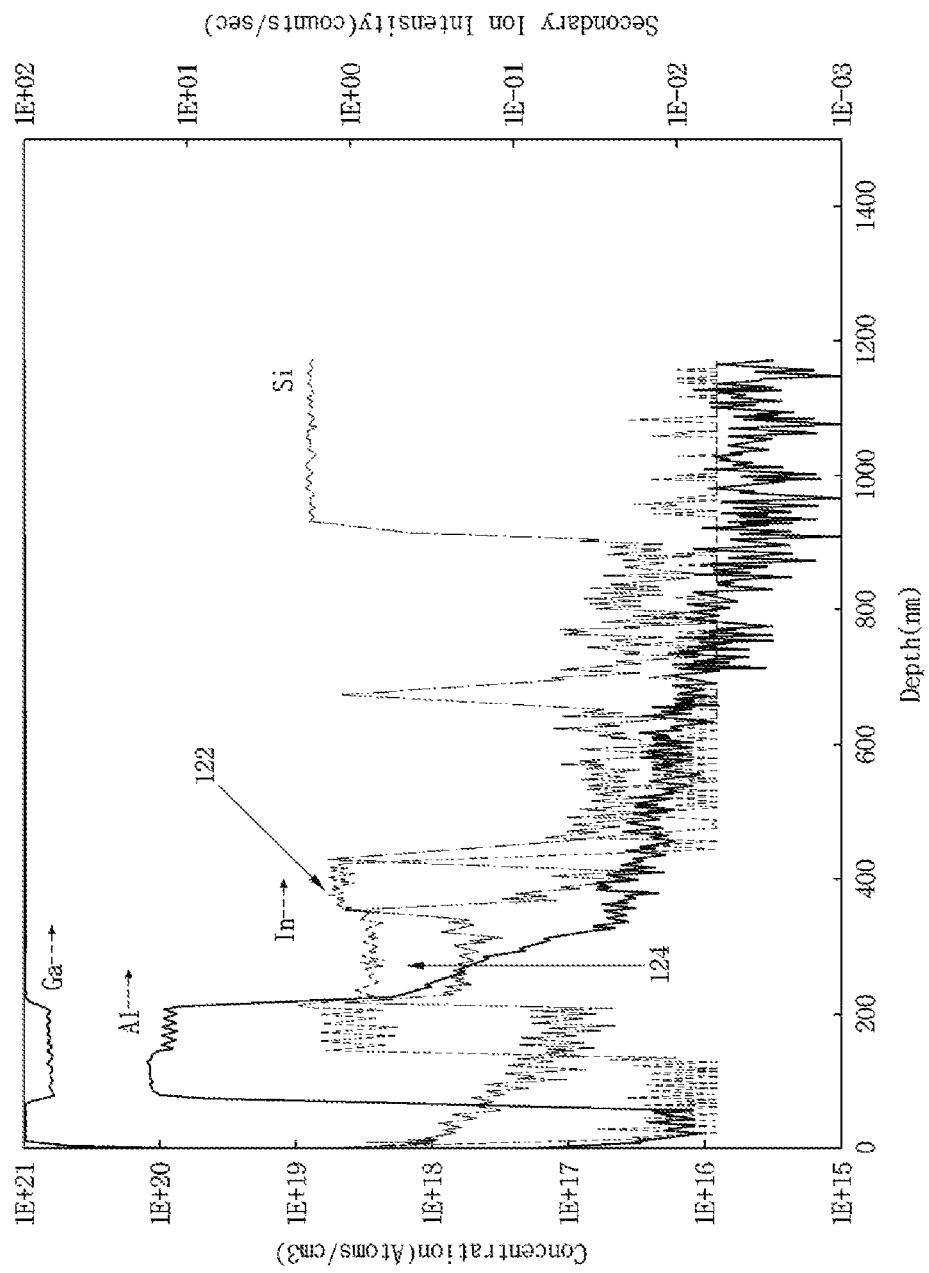
FIG. 2 is a diagram showing the composition of a light emitting device according to an embodiment.

FIG. 1 is a cross-sectional view of a light emitting device 100 according to an embodiment, and FIG. 2 is a diagram showing the composition of a light emitting device according to an embodiment.

Figure 3:
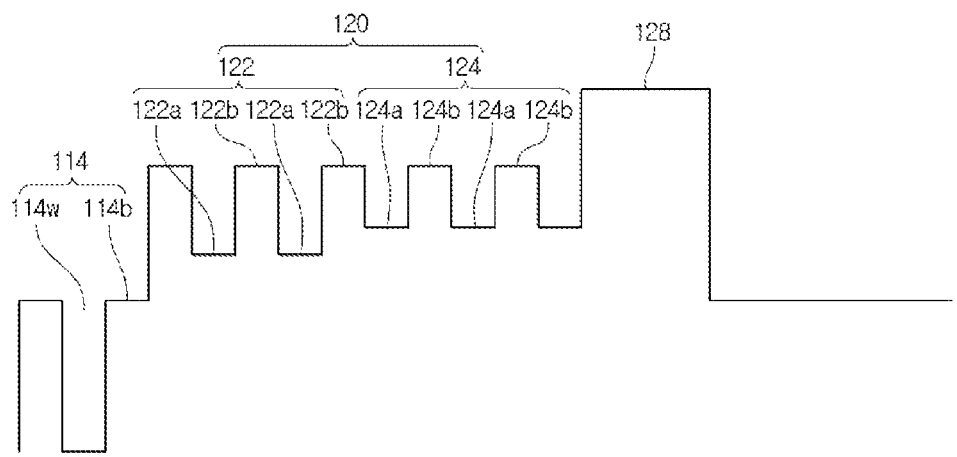
FIG. 3 is a view showing a first part of a band diagram of a light emitting device according to an embodiment.

FIG. 3 is a view showing a first part of a band diagram of a light emitting device according to an embodiment.

The light emitting device 100 according to the embodiment may include a first conductivity type semiconductor layer 112, an active layer 114 formed on the first conductivity type semiconductor layer 112, a gallium nitride based superlattice layer 120 formed on the active layer 114, and a second conductivity semiconductor layer 116 formed on the gallium nitride based superlattice layer 120.

The active layer 114 includes a quantum well 114w and a quantum barrier 114b, and the first conductivity type semiconductor layer 112, the active layer 114 and the second conductivity type semiconductor layer 116 may configure a light emitting structure 110.

The embodiment may include a transparent electrode 130 disposed on the second conductivity type semiconductor layer 116, a second electrode 152 disposed on the transparent electrode 130 and a first electrode 151 electrically connected to the first conductivity type semiconductor layer 112.

Although a horizontal light emitting device, in which electrodes are disposed in the same direction, is shown in FIG. 1, the present invention is not limited thereto.

The embodiment includes an aluminum gallium based nitride semiconductor layer 128 formed on the gallium nitride based superlattice layer 120, thereby increasing light emitting efficiency through an electron blocking function.

In the embodiment, the gallium nitride based superlattice layer 120 may include a first gallium nitride based superlattice layer 122 formed on the active layer 114 and a second gallium nitride based superlattice layer 124 formed on the first gallium nitride based superlattice layer 122.

In the embodiment, the first gallium nitride based superlattice layer 122 may be disposed between the active layer 114 and the second gallium nitride based superlattice layer 124.

That is, the first gallium nitride based superlattice layer 122 may be disposed closer to the active layer 114 than the second gallium nitride based superlattice layer 124.

According to the embodiment, as shown in FIG. 3, the band gap energy of the first gallium nitride based superlattice layer 122 may be less than that of the second gallium nitride based superlattice layer 124.

For example, the first gallium nitride based superlattice layer 122 may include $In_xGa_{1-x}N/Al_yGa_{1-y}N$ (0<x<1, 0<y<1).

For example, the first gallium nitride based superlattice layer 122 may include $In_{x1}Ga_{1-x1}N$ 122a/$Al_{y1}Ga_{1-y1}N$ 122b (0<X1<1, 0≤y1<1) and the second gallium nitride based superlattice layer 124 may include $In_{x2}Ga_{1-x2}N$ 124a/$Al_{y2}Ga_{1-y2}N$ 124b (0<x2<1, 0≤y2<1).

At this time, as shown in FIG. 2, the concentration x1 of indium in the first gallium nitride based superlattice layer 122 is greater than the concentration x2 of indium in the second gallium nitride based superlattice layer 124, thereby significantly increasing electron reservoir effects.

For example, as shown in FIG. 3, the band gap energy of the first gallium nitride based superlattice layer 122 may be less than that of the second gallium nitride based superlattice layer 124.

TABLE 1

|  | Luminosity (Po) | Operating voltage (VF3) |
| --- | --- | --- |
| Comparative example | 449.1 | 3.45 |
| Experimental example | 497.4 | 3.33 |

Table 1 shows comparison between the luminosities and operating voltages of the light emitting device 100 of the experimental example and the comparative example.

According to the embodiment, the first gallium nitride based superlattice layer 122 disposed between the second gallium nitride based superlattice layer 124 and the active layer 114 and having band gap energy less than that of the second gallium nitride based superlattice layer 124 is provided to efficiently store electrons, thereby preventing overflow of electrons and increasing light emitting efficiency. Therefore, luminosity Po is increased as shown in Table 1.

In addition, according to the embodiment, the first gallium nitride based superlattice layer 122 and the second gallium nitride based superlattice layer 124 are disposed between the second conductivity type semiconductor layer 116 and the active layer 114 to achieve effective current spreading. Therefore, as shown in Table 1, the operating voltage VF3 and luminosity Po are improved.

In the embodiment, if the first gallium nitride based superlattice layer 122 includes $In_{x1}Ga_{1-x1}N/Al_{y1}Ga_{1-y1}N$ (0<X1<1, 0≤1<1), the concentration x1 of indium in the first gallium nitride based superlattice layer 122 may be less than or equal to that of indium in the quantum well of the active layer 114.

If the concentration x1 of indium in the first gallium nitride based superlattice layer 122 is greater than that of indium in the quantum well of the active layer 114, optical loss may be generated due to light absorption and electron trapping.

The light emitting device according to the embodiment may be a UV light emitting device employing an AlGaN barrier, without being limited thereto.

In the embodiment, the concentration y1 of aluminum in the first gallium nitride based superlattice layer 122 may be less than that of aluminum in the quantum wall of the active layer 114.

In the embodiment, if the concentration y1 of aluminum in the first gallium nitride based superlattice layer 122 is greater than that of aluminum in the quantum wall of the active layer 114, operating voltage VF3 may increase or luminosity may deteriorate due to the barrier.

In the embodiment, the first gallium nitride based superlattice layer 122 may be doped with a first conductivity type doping element, e.g., Si and the doping concentration may be less than $1\times10^{19}$ (atoms/cm$^3$). If the doping concentration of the first conductivity type element is greater than or equal to $1\times10^{19}$ (atoms/cm$^3$), low current may be generated due to electron tunneling, thereby decreasing yield.

In the embodiment, in the first gallium nitride based superlattice layer 122, the thickness of an $In_{x1}Ga_{1-x1}N$ layer or an $Al_{y1}Ga_{1-y1}N$ layer may be about 1 nm to about 3 nm and may grow up to about 10 pairs to 30 pairs, without being limited thereto.

Figure 4:
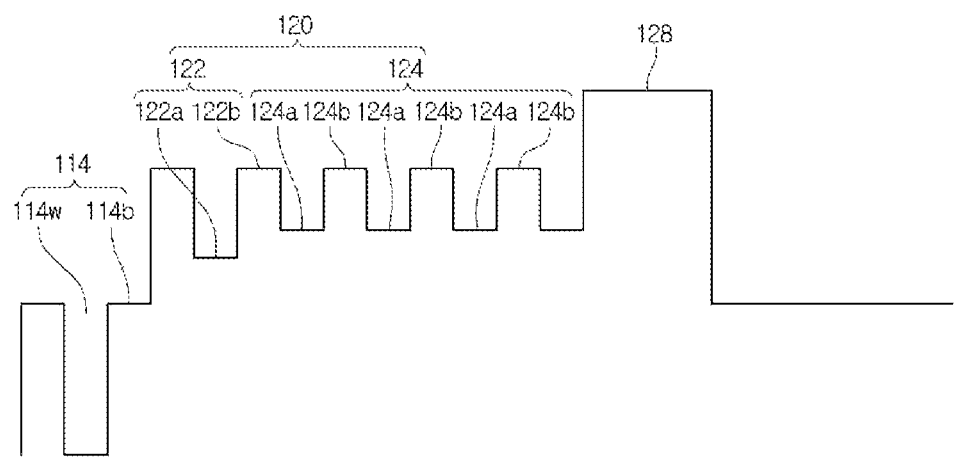
FIG. 4 is a view showing a second part of a band diagram of a light emitting device according to an embodiment.

FIG. 4 is a view showing a second part of a band diagram of a light emitting device according to an embodiment.

In the embodiment, the thickness of the first gallium nitride based superlattice layer 122 may be less than that of the second gallium nitride based superlattice layer 124.

For example, the number of pairs of the first gallium nitride based superlattice layer 122 may be less than the number of pairs of the second gallium nitride based superlattice layer 124, thereby increasing a current spreading function to maximally improve luminosity and to efficiently decrease an operating voltage while optimizing a ratio of In having a large lattice constant and maximizing an electron blocking function and an electron reservoir function.

The embodiment can provide a light emitting device capable of maximizing an electron blocking function to improve light emitting efficiency.

The embodiment can provide a light emitting device capable of improving a current spreading function to improve light emitting efficiency.

Hereinafter, a method of manufacturing a light emitting device according to an embodiment will be described with reference to FIGS. 5 to 7.

Figure 5:
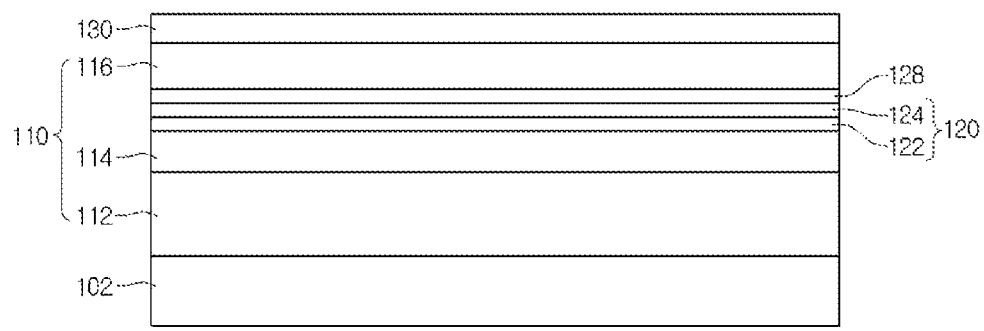
FIGS. 5 to 7 are views showing a method of manufacturing a light emitting device according to an embodiment.

First, as shown in FIG. 5, a substrate 102 is prepared. The substrate 102 may be formed of a material having excellent thermal conductivity and may be a conductive substrate or an insulating substrate.

For example, the substrate 102 may use at least one of sapphire ($Al_2O_3$), SiC, Si, GaAs, GaN, ZnO, GaP, InP, Ge, and $Ga_2O_3$. An uneven structure may be formed on the substrate 102 without being limited thereto.

At this time, a buffer layer (not shown) may be formed on the substrate 102. The buffer layer may reduce lattice mismatch between the substrate 102 and the material of a light emitting structure 110 to be formed thereafter and the buffer layer may be formed of at least one of Group III-V compound semiconductors such as GaN, InN, AlN, InGaN, AlGaN, InAlGaN, and AlInN.

Next, the light emitting structure 110 including a first conductivity type semiconductor layer 112, an active layer 114 and a second conductivity type semiconductor layer 116 may be formed on the first substrate 102.

The first conductivity type semiconductor layer 112 may be formed of compound semiconductors. The first conductivity type semiconductor layer 112 may be implemented by Group III-V or Group II-VI compound semiconductors or may be doped with a first conductivity type dopant. If the first conductivity type semiconductor layer 112 is an n-type semiconductor layer, the first conductivity type dopant is an n-type dopant and may include Si, Ge, Sn, Se and Te without being limited thereto.

The first conductivity type semiconductor layer 112 may include a semiconductor material having a formula of $In_xAl_yGa_{1-x-y}N$ ($0 \leq x \leq 1$, $0 \leq y \leq 1$, $0 \leq x+y \leq 1$).

The first conductivity type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP and InP.

The active layer 114 may be formed in at least one of a single quantum well structure, a multi quantum well (MQW) structure, a quantum-wire structure or a quantum dot structure. For example, the active layer 114 may be formed in a multi quantum well structure by injecting trimethylgallium (TMGa) gas, ammonia ($NH_3$) gas, nitrogen ($N_2$) gas and trimethyindium (TMIn) gas, without being limited thereto.

The quantum well 114w/quantum barrier 114b of the active layer 114 may be formed in a structure having one or more pairs of InGaN/GaN, InGaN/InGaN, GaN/AlGaN, InGaN/AlGaN, InAlGaN/GaN, or GaAs(InGaAs)/AlGaAs, GaP(InGaP)/AlGaP, without being limited thereto.

Next, the gallium nitride based superlattice layer 120 may be formed on the active layer 114.

The gallium nitride based superlattice layer 120 may include the first gallium nitride based superlattice layer 122 formed on the active layer 114 and the second gallium nitride based superlattice layer 124 formed on the first gallium nitride based superlattice layer 122.

The first gallium nitride based superlattice layer 122 may be disposed closer to the active layer 114 than the second gallium nitride based superlattice layer 124.

According to the embodiment, as shown in FIG. 3, the band gap energy of the first gallium nitride based superlattice layer 122 may be less than that of the second gallium nitride based superlattice layer 124.

For example, the first gallium nitride based superlattice layer 122 may include $In_{x1}Ga_{1-x1}N$ 122a/$Al_{y1}Ga_{1-y1}N$ 122b ($0<X1<1$, $0 \leq y1<1$) and the second gallium nitride based superlattice layer 124 may include $In_{x2}Ga_{1-x2}N$ 124a/$Al_{y2}Ga_{1-y2}N$ 124b ($0<x2<1$, $0 \leq y2<1$).

In the embodiment, in the first gallium nitride based superlattice layer 122, the thickness of an $In_{x1}Ga_{1-x1}N$ layer or an $Al_{y1}Ga_{1-y1}N$ layer may be about 1 nm to about 3 nm and may grow up to about 10 pairs to 30 pairs, without being limited thereto.

At this time, as shown in FIG. 2, the concentration x1 of indium in the first gallium nitride based superlattice layer 122 is greater than the concentration x2 of indium in the second gallium nitride based superlattice layer 124, thereby significantly increasing electron reservoir effects.

For example, as shown in FIG. 3, the band gap energy of the first gallium nitride based superlattice layer 122 may be less than that of the second gallium nitride based superlattice layer 124.

According to the embodiment, the first gallium nitride based superlattice layer 122 disposed between the second gallium nitride based superlattice layer 124 and the active layer 114 and having band gap energy less than that of the second gallium nitride based superlattice layer 124 is provided to efficiently store electrons, thereby preventing overflow of electrons and increasing light emitting efficiency.

In addition, according to the embodiment, the first gallium nitride based superlattice layer 122 and the second gallium nitride based superlattice layer 124 are disposed between the second conductivity type semiconductor layer 116 and the active layer 114 to lead to efficient current spreading. Therefore, the operating voltage VF3 and luminosity Po are improved.

In the embodiment, if the first gallium nitride based superlattice layer 122 includes $In_{x1}Ga_{1-x1}N/Al_{y1}Ga_{1-y1}N$ ($0<X1<1$, $0 \leq y1<1$), the concentration x1 of indium in the first gallium nitride based superlattice layer 122 may be less than or equal to that of indium in the quantum well of the active layer 114.

If the concentration x1 of indium in the first gallium nitride based superlattice layer 122 is greater than that of indium in the quantum well of the active layer 114, optical loss may be generated due to light absorption and electron trapping.

In the embodiment, the concentration y1 of aluminum in the first gallium nitride based superlattice layer 122 may be less than that of aluminum in the quantum wall of the active layer 114.

If the concentration y1 of aluminum in the first gallium nitride based superlattice layer 122 is greater than that of aluminum in the quantum wall of the active layer 114, operating voltage VF3 may increase or luminosity may deteriorate due to the barrier.

In the embodiment, the first gallium nitride based superlattice layer 122 may be doped with a first conductivity type doping element, e.g., Si and the doping concentration may be less than $1 \times 10^{19}$ (atoms/$cm^3$).

In the embodiment, as shown in FIG. 4, the thickness of the first gallium nitride based superlattice layer 122 may be less than that of the second gallium nitride based superlattice layer 124.

For example, the number of pairs of the first gallium nitride based superlattice layer 122 may be less than the number of pairs of the second gallium nitride based superlattice layer 124, thereby increasing a current spreading function to maximally improve luminosity and to efficiently decrease an operating voltage while optimizing a ratio of In having a large lattice constant and maximizing an electron blocking function and an electron reservoir function.

Next, the aluminum gallium based nitride semiconductor layer 128 may be formed on the second gallium nitride based superlattice layer 124.

The aluminum gallium based nitride semiconductor layer 128 performs an electron blocking function and functions as the cladding (MQW cladding) of the active layer, thereby improving light emitting efficiency.

For example, the aluminum gallium based nitride semiconductor layer 128 may be formed of $Al_xIn_yGa_{(1-x-y)}N$ ($0 \leq x \leq 1, 0 \leq y \leq 1$) based semiconductors and may have a higher band gap energy than that of the active layer 114 and a thickness of about 100 Å to about 600 Å, without being limited thereto.

Thereafter, the second conductivity type semiconductor layer 116 may be formed on the aluminum gallium based nitride semiconductor layer 128 and may be formed of compound semiconductors.

The second conductivity type semiconductor layer 116 may include a semiconductor material having a formula of $In_xAl_yGa_{1-x-y}N$ ($0 \leq x \leq 1$, $0 \leq y \leq 1$, $0 \leq x+y \leq 1$). If the second conductivity type semiconductor layer 116 is a p-type semiconductor layer, the second conductivity dopant is a p-type dopant and may include Mg, Zn, Ca, Sr, Ba, etc.

In the embodiment, the first conductivity semiconductor layer 112 may be implemented by an n-type semiconductor layer and the second conductivity type semiconductor layer 116 may be implemented by a p-type semiconductor layer, without being limited thereto.

In addition, a semiconductor layer, e.g., an n-type semiconductor layer (not shown) having a polarity opposite to that of the second conductivity type semiconductor layer may be formed on the second conductivity type semiconductor layer 116. Therefore, the light emitting structure 110 may be implemented in any one of an n-p junction structure, a p-n junction structure, an n-p-n junction structure and a p-n-p junction structure.

Thereafter, a transparent electrode 130 is formed on the second conductivity type semiconductor layer 116.

For example, the transparent electrode 130 may include an ohmic layer and may be formed by laminating metal, metal alloy or metallic oxide such that holes are efficiently injected.

For example, the transparent electrode 130 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Jr, Ru, Mg, Zn, Pt, Au and Hf without being limited thereto.

Figure 6:
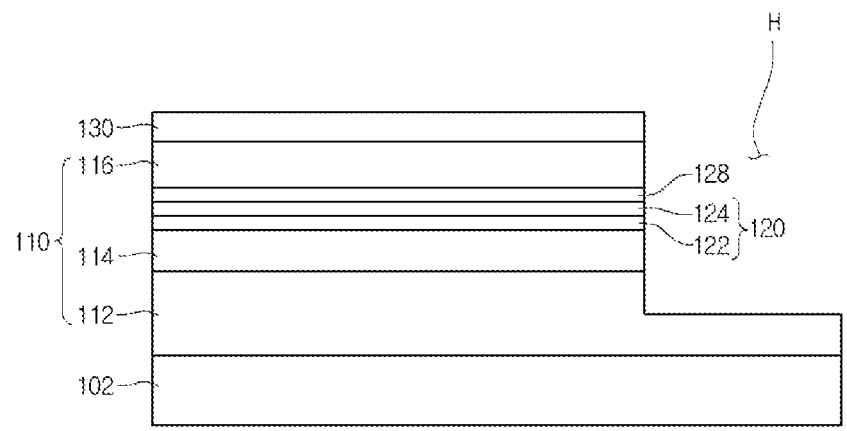

Next, as shown in FIG. 6, portions of the transparent electrode 130, the second conductivity type semiconductor layer 116, the aluminum gallium based nitride semiconductor layer 128, the second gallium nitride based superlattice layer 124, the first gallium nitride based superlattice layer 122 and the active layer 114 may be removed such that the first conductivity semiconductor layer 112 is exposed.

Figure 7:
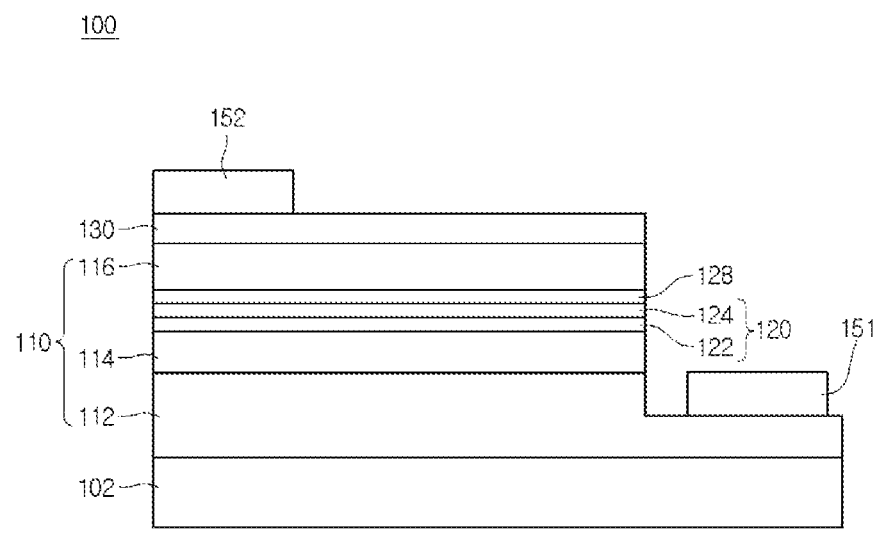

Next, as shown in FIG. 7, a second electrode 152 is formed on the transparent electrode 130 and a first electrode 151 is formed on the exposed first conductivity semiconductor layer 112, thereby forming a light emitting device according to the embodiment.

Embodiments can provide a light emitting device capable of maximizing an electron blocking function to improve light emitting efficiency, a method of manufacturing a light emitting device, a light emitting device package and a lighting system.

Embodiments can provide a light emitting device capable of improving a current spreading function to improve light emitting efficiency, a method of manufacturing a light emitting device, a light emitting device package and a lighting system.

Figure 8:
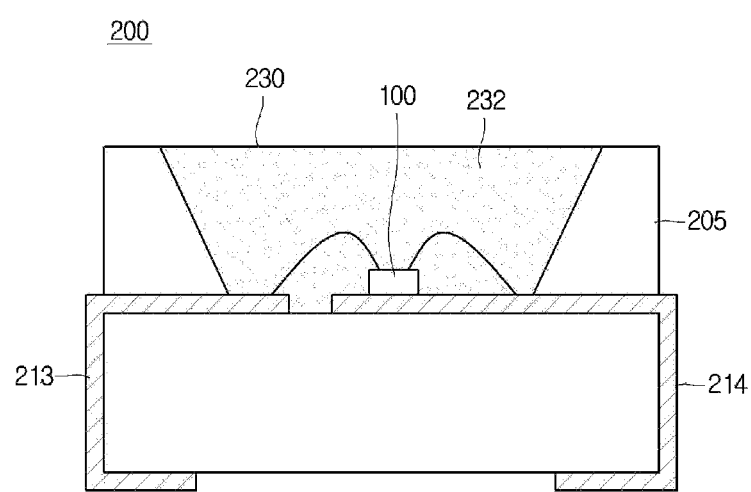
FIG. 8 is a cross-sectional view of a light emitting device package according to an embodiment.

FIG. 8 is a cross-sectional view of a light emitting device package according to an embodiment.

The light emitting device package includes a package body 205, third and fourth electrode layers 213 and 214 mounted on the package body 205, a light emitting device 100 mounted on the package body 205 and electrically connected to the third and fourth electrode layers 213 and 214 and a molding member 230 surrounding the light emitting device 100.

The third electrode layer 213 and the fourth electrode layer 214 are electrically disconnected and are responsible for supplying power to the light emitting device 100. In addition, the third electrode layer 213 and the fourth electrode layer 214 may be responsible for reflecting light generated by the light emitting device 100 to increase light efficiency and discharging heat generated in the light emitting device 100.

The light emitting device 100 may be electrically connected to the third electrode layer 213 and/or the fourth electrode layer 214 using any one of a wiring method, a flip chip method or a die bonding method.

Figure 9:
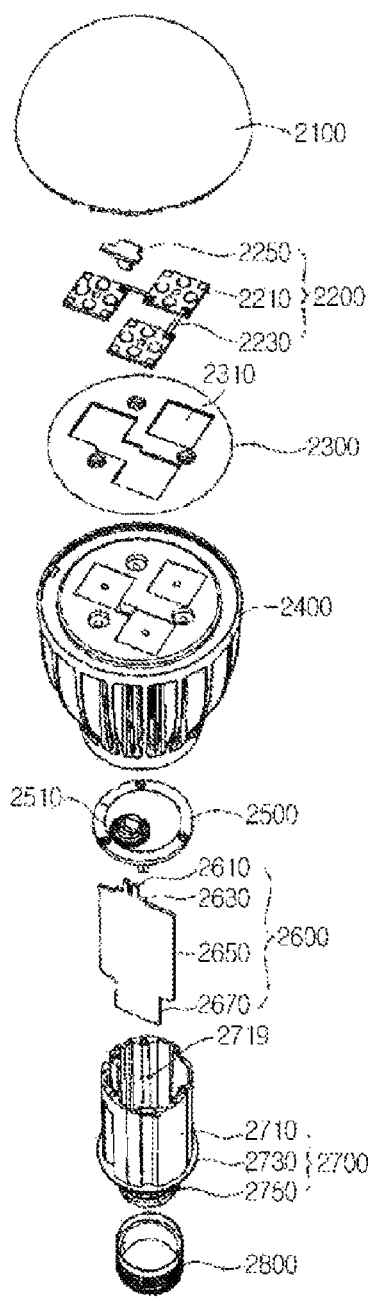
FIG. 9 is a perspective view of a lighting system according to an embodiment.

FIG. 9 is an exploded perspective view of a lighting system according to an embodiment.

The lighting system according to the embodiment may include a cover 2100, a light source module 2200, a heat dissipating body 2400, a power supply 2600, an inner case 2700 and a socket 2800. The lighting system according to the embodiment may further include at least one of a member 2300 and a holder 2500. The light source module 220 may include the light emitting device or the light emitting device package according to the embodiment.

The light source module 2200 may include a plurality of light sources 2210, a connection plate 2230 and a connector 2250. The member 2300 is disposed on the upper surface of the heat dissipating body 2400 and has guide grooves 2310, into which the plurality of light sources 2210 and the connector 2250 are inserted.

The holder 2500 blocks the accommodation groove 2719 of the insulation part 2710 of the inner case 2700. Accordingly, the power supply 2600 accommodated in the insulation part 2710 of the inner case 2700 is enclosed. The holder 2500 has a guide protrusion 2610.

The power supply 2600 may include a protrusion 2610, a guide 2630, a base 2650 and an extension 2670. The inner case 2700 may include a molding part provided therein in addition to the power supply 2600. The molding part is obtained by hardening molding liquid and fixes the power supply 2600 in the inner case 2700.

The features, structures and effects of the embodiments are included in at least one embodiment of the present invention and are not limited to one embodiment. Further, the features, structures and effects of each embodiment may be combined or modified by those skilled in the art in other embodiments. Accordingly, the description related to such combinations and modifications should be interpreted as within the scope of the present invention.

Although the preferred embodiments have been disclosed, the embodiments are purely exemplary and do not limit the present disclosure. Those skilled in the art will appreciate that various modifications and applications are possible, without departing from the embodiments. For example, the components described in the embodiments may be modified and embodied. Further, differences related to such modifications and applications should be interpreted as being within the scope of the present disclosure defined by the accompanying claims.

The invention claimed is:

1. A light emitting device comprising:
a first conductivity type semiconductor layer;
an active layer on the first conductivity type semiconductor layer;
a gallium nitride based superlattice layer on the active layer; and
a second conductivity type semiconductor layer on the gallium nitride based superlattice layer,
wherein the gallium nitride based superlattice layer includes:
a first gallium nitride based superlattice layer directly contacting the active layer and including first regions including $In_{x1}Ga_{1-x1}N$ (0<x1<1) and second regions including $Al_{y1}Ga_{1-y1}N$ (0≤y1<1); and
a second gallium nitride based superlattice layer on the first gallium nitride based superlattice layer and including first regions including $In_{x2}Ga_{1-x2}N$ (0<x2<1) and second regions including $Al_{y2}GR_{1-y2}N$ (0≤y2<1),
wherein the concentration of aluminum in the second regions of the first gallium nitride based superlattice layer is less than that of aluminum in a quantum well of the active layer,
wherein band gap energy of the second regions of the first gallium nitride based superlattice layer is identical to that of the second regions of the second gallium nitride based superlattice layer and is greater than that of the quantum well of the active layer,
wherein band gap energy of the first regions of the first gallium nitride based superlattice layer is less than that of the second gallium nitride based superlattice layer, and
wherein band gap energy of a quantum well of the active layer is less than that of the first regions of the first gallium nitride based superlattice layer.

2. The light emitting device according to claim 1, further comprises a semiconductor layer between the gallium nitride based superlattice layer and the second conductivity type semiconductor layer includes an aluminum gallium based nitride,
wherein band gap energy of the second regions of the second gallium nitride based superlattice layer is less than that of the semiconductor layer.

3. The light emitting device according to claim 1,
wherein the first regions of the first gallium nitride based superlattice layer have the same band gap energy, and the second regions of the first gallium nitride based superlattice layer have the same band gap energy.

4. The light emitting device according to claim 1, wherein a concentration of indium in the first gallium nitride based superlattice layer is greater than a concentration of indium in the second gallium nitride based superlattice layer.

5. The light emitting device according to claim 4, wherein the concentration of indium in the first gallium nitride based superlattice layer is less than or equal to a concentration of indium in a quantum well of the active layer.

6. The light emitting device according to claim 1, wherein a thickness of the first gallium nitride based superlattice layer is less than that of the second gallium nitride based superlattice layer.

7. The light emitting device according to claim 2, wherein the first gallium nitride based superlattice layer is disposed between the active layer and the second gallium nitride based superlattice layer,
the second gallium nitride based superlattice layer is disposed between the first gallium nitride based superlattice layer and the semiconductor layer.

8. The light emitting device according to claim 1, wherein the first gallium nitride based superlattice layer includes a first conductivity type doping element.

9. The light emitting device according to claim 8, wherein a doping concentration of the first conductivity type doping element is less than $1 \times 10^{19}$ (atoms/cm$^3$).

10. The light emitting device according to claim 1, wherein band gap energy of a quantum barrier of the active layer is less than that of the second regions of the first gallium nitride based superlattice layer.

11. The light emitting device according to claim 1, wherein a number of pairs of the first gallium nitride based superlattice layer is less than a number of pairs of the second gallium nitride based superlattice layer.

12. A light emitting device comprising:
a first conductivity type semiconductor layer;
an active layer on the first conductivity type semiconductor layer;
a gallium nitride based superlattice layer on the active layer;
a second conductivity type semiconductor layer on the gallium nitride based superlattice layer; and
a semiconductor layer between the gallium nitride based superlattice layer and the second conductivity type semiconductor layer includes an aluminum gallium based nitride;
wherein the gallium nitride based superlattice layer includes:
a first gallium nitride based superlattice layer directly contacting the active layer and including first regions including $In_{x1}Ga_{1-x1}N$ (0x1<1) and a second region including $Al_{y1}Ga_{1-y1}N$ (0≤y1<1); and
a second gallium nitride based superlattice layer on the first gallium nitride based superlattice layer and including first regions including $In_{x2}Ga_{1-x2}N$ (0<x2<1) and a second region including $Al_{y2}Ga_{1-y2}N$ (0≤y2<1),
wherein the concentration of aluminum in the second region of the first gallium nitride based superlattice layer is less than that of aluminum in a quantum well of the active layer,
wherein band gap energy of the second region of the first gallium nitride based superlattice layer is identical to that of the second region of the second gallium nitride based superlattice layer and is greater than that of the quantum well of the active layer,
wherein band gap energy of the first regions of the first gallium nitride based superlattice layer is less than that of the first regions of the second gallium nitride based superlattice layer,
wherein band gap energy of a quantum well of the active layer is less than that of first regions of the first gallium nitride based superlattice layer, and
wherein band gap energy of the second region of the second gallium nitride based superlattice layer is less than that of the semiconductor layer.

13. The light emitting device according to claim 12, wherein the first regions of the first gallium nitride based superlattice layer have the same band gap energy, and the second regions of the first gallium nitride based superlattice layer have the same band gap energy.

14. The light emitting device according to claim 12, wherein a concentration of indium in the first gallium nitride based superlattice layer is greater than a concentration of indium in the second gallium nitride based superlattice layer, and wherein the concentration of indium in the first regions of the first gallium nitride based superlattice layer is less than or equal to a concentration of indium in the quantum well of the active layer.

15. The light emitting device according to claim 12, wherein a thickness of the first gallium nitride based superlattice layer is less than that of the second gallium nitride based superlattice layer.

16. The light emitting device according to claim 12, wherein a doping concentration of a first conductivity type doping element in the first gallium nitride based superlattice layer is less than $1 \times 10^{19}$ (atoms/cm$^3$).

17. The light emitting device according to claim 13, wherein band gap energy of a quantum barrier of the active layer is less than that of the second region of the first gallium nitride based superlattice layer.

18. The light emitting device according to claim 12, wherein a number of pairs of the first gallium nitride based superlattice layer is less than a number of pairs of the second gallium nitride based superlattice layer.

* * * * *